United States Patent [19]

Tsukiyama et al.

[11] Patent Number: 4,866,440

[45] Date of Patent: Sep. 12, 1989

[54] METHOD FOR COMPRESSING AND RESTORING DATA SERIES AND APPARATUS FOR REALIZING SAME

[75] Inventors: Tokuhiro Tsukiyama, Kanagawa; Yasunori Sagara, Odawara; Kazumi Miyazawa, Kanagawa, all of Japan

[73] Assignee: Hitachi, Ltd., Tokyo, Japan

[21] Appl. No.: 129,185

[22] Filed: Dec. 7, 1987

[30] Foreign Application Priority Data

Dec. 12, 1986 [JP] Japan ................................ 61-294821

[51] Int. Cl.[4] ................................................ H03M 7/46

[52] U.S. Cl. ........................................ 341/95; 341/59; 341/67

[58] Field of Search ................ 340/347 DD; 364/200, 364/900; 358/261; 360/39, 40, 48; 341/50, 59, 61, 63, 67, 95, 107

[56] References Cited

U.S. PATENT DOCUMENTS

| | | | |
|---|---|---|---|
| 4,542,515 | 9/1985 | Gutleber | 340/347 DD |
| 4,558,302 | 12/1985 | Welch | 341/95 |
| 4,586,027 | 4/1986 | Tsukiyama | 340/347 DD |
| 4,701,745 | 10/1987 | Waterworth | 341/63 |
| 4,814,746 | 3/1989 | Miller et al. | 341/95 |

FOREIGN PATENT DOCUMENTS

| | | |
|---|---|---|
| 2625527.6 | 3/1978 | Fed. Rep. of Germany . |
| 3742142.5 | 6/1988 | Fed. Rep. of Germany . |

*Primary Examiner*—William M. Shoop, Jr.
*Assistant Examiner*—Brian Young
*Attorney, Agent, or Firm*—Kenyon & Kenyon

[57] ABSTRACT

A data compression and restoration method and an apparatus for realizing same, by which, when identical data patterns appear successively in data information, which may be recorded in a magnetic tape, etc., the data patterns are subjected to a compression operation, the data thus compressed is recorded, and it is restored at the reproduction. When the data patterns appear successively, they are compressed, and the data patterns generated by the compression are subjected to a second compression, after they have been rearranged for the purpose of the second compression. In this way it is possible to record data significantly compressed.

14 Claims, 3 Drawing Sheets

FIG. 1
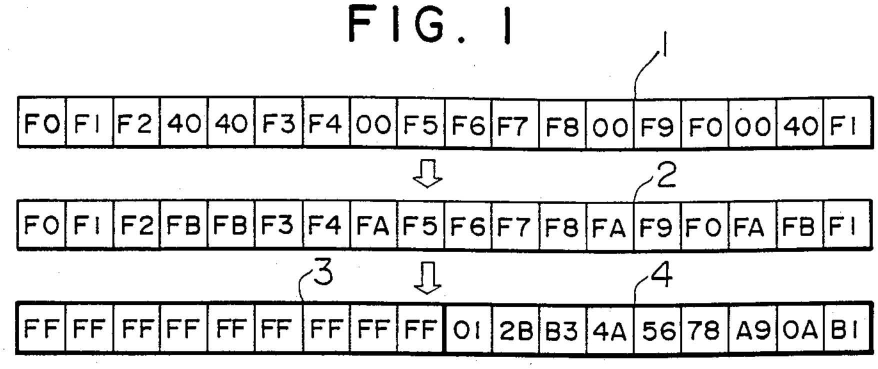
FIG. 2
| INPUT DATA | TRANSFORMATION DATA |
|---|---|
| 00 | FA |
| 40 | FB |
| F0 | F0 |
| F1 | F1 |
| F2 | F2 |
| F3 | F3 |
| F4 | F4 |
| F5 | F5 |
| F6 | F6 |
| F7 | F7 |
| F8 | F8 |
| F9 | F9 |
FIG. 3
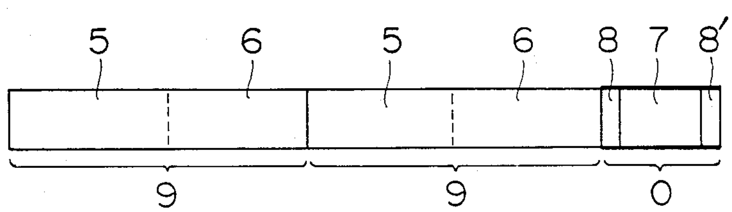

METHOD FOR COMPRESSING AND RESTORING DATA SERIES AND APPARATUS FOR REALIZING SAME

BACKGROUND OF THE INVENTION

This invention relates to a method for compressing and restoring data in a magnetic tape memory device, etc. and an apparatus for realizing same and in particular to a method for compressing and restoring data, which is capable of increasing the data compression ratio, and an apparatus for realizing same.

As a method for compressing and restoring data in a magnetic tape memory device according to prior art techniques there is known a method based on the so-called run-length method, by which a portion consisting of a repetition of identical patterns in byte unit is searched from data to be recorded and these successive identical patterns are compressed and recorded in a magnetic tape, as disclosed in U.S. Pat. No. 4,586,027.

According to the prior art technique described above, whether a portion in question is a repetition of identical patterns or not (hereinafter simply referred to as "successiveness") is judged in one-byte unit. Therefore, even though a series of data to be written is not successive when the successiveness is considered by one-byte unit, it is likely that it contains many portions which can be compressed by the above method if the successiveness is considered with respect to high-order 4 bit (half byte) groups or low-order 4 bit groups of the data series. For this reason, it can be said that the compression efficiency according to the prior art technique is not always high.

SUMMARY OF THE INVENTION

An object of this invention is to provide a method for compressing and restoring data, which, in compressing a series of data, is capable of increasing the compression ratio without modifying the basic data compression format and its procedure, and an apparatus for realizing same.

In order to achieve the object described above, according to one aspect of this invention, given data is compressed on the basis of the successiveness of identical patterns in one-byte unit as by the prior art method and after that the information thus obtained by the compression described above is rearranged so that it can be again compressed and compressed once more.

For example, in the case when numerals in EBCDIC (F0, F1, F2, F3, F4, F6, F7, F8, F9) are successively present, when the successiveness of the data is considered in one-byte unit, they are not successive, but when attention is paid to the group of the high-order 4 bits in one byte, it can be seen that "F"s (HEX) are successive and thus this group of "F"s is compressible. Further, also for the alphanumeric characters, Japanese Kana characters (syllabic characters) and special signs, if data is transformed, depending on such matters as their appearance rate, the probability of the appearance of combinations of characters, combinations regulated by grammatical reasons or the like so that information consisting of high-order 4 bits (half byte) or low-order 4 bits (half byte) in one byte has an increased successiveness, the successiveness of identical patterns in half byte unit described above is raised and it is possible to increase further the compression ratio described above.

BRIEF DESCRIPTION OF THE DRAWINGS

FIG. 1 is a scheme illustrating the transformation process of the data format according to this invention;

FIG. 2 is a scheme showing an example of the data transformation table according to an embodiment of this invention;

FIG. 3 is a scheme for explaining the recording format on a magnetic tape after data compression;

DESCRIPTION OF THE PREFERRED EMBODIMENTS

Figure 4:
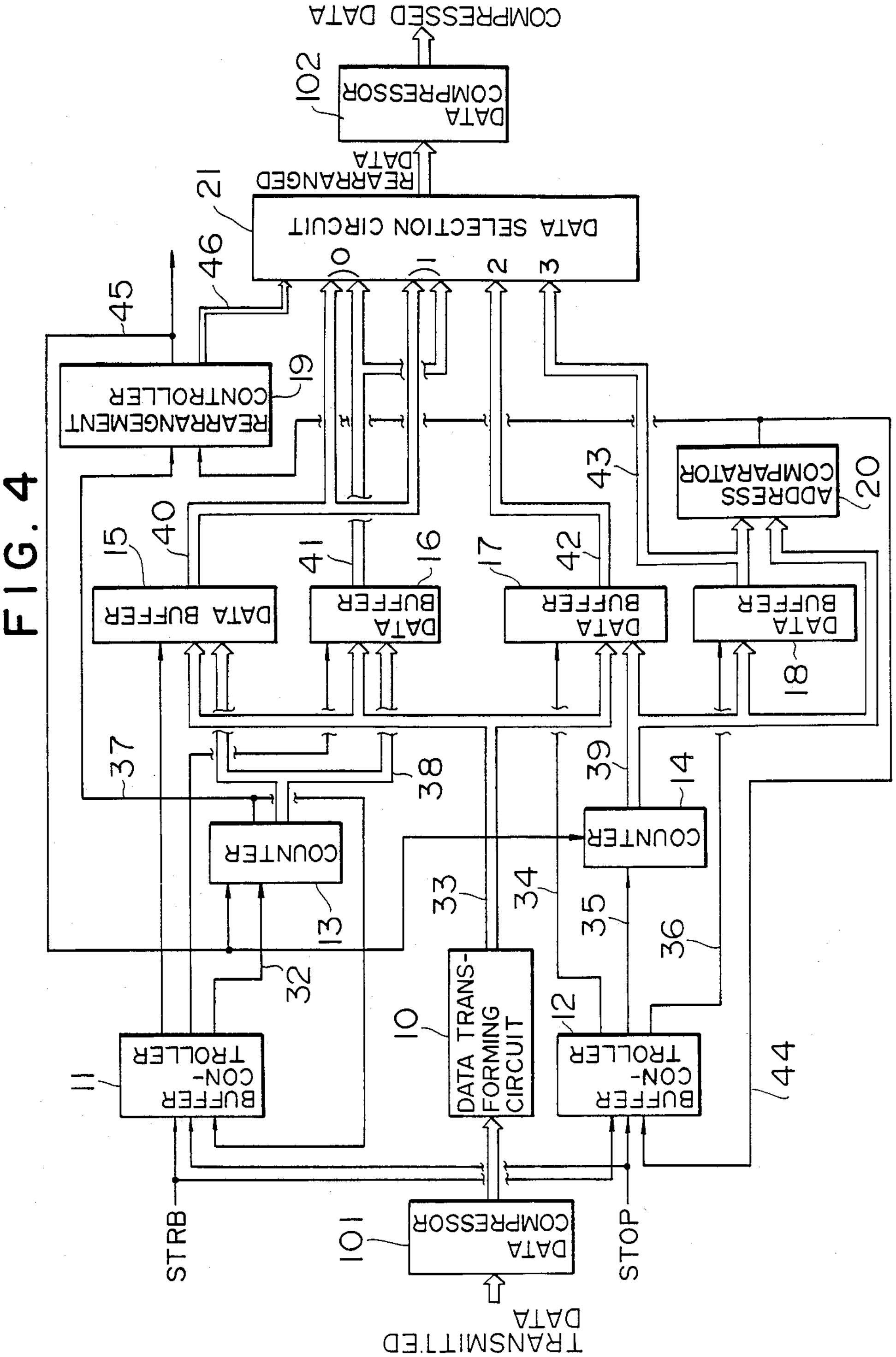
FIG. 4 is a scheme illustrating a half byte rearrangement circuit according to an embodiment of this invention.

Hereinbelow an embodiment of the compression and restoration method according to this invention will be explained.

In general data for computer in a magnetic tape memory device, etc. contains many numerals and special signs. Thus, according to this invention, data is compressed by the run-length method and the data after compression is transformed once more. This transformation is effected by using a transformation table so that the successiveness considered with respect to the above-mentioned half byte unit is increased. With regard to the transformation table for effecting this transformation, for the appearance frequency distribution of, for example, English letters, the space is the most frequent and "E" is the second most frequent letter. Consequently the probability that a space and an "E" appear successively, is high. Therefore, if these letters are transformed so that the high-order half bytes or the low-order half bytes thereof are succession of an identical pattern, the successiveness of the half byte is increased. Further, when combinations of two letters are considered, since configuration such as "TH". "ED" or the like is found frequently in English language, it is possible to increase the successiveness of the half bytes by transforming these configurations by a data transformation similar to that described above.

With regard to the Japanese Kana character series which is similar to alphabet, the voiced sound sign (") exists only for KA, KI, KU, KE, KO, SA, SI, SU, SE, SO, TA, CHI, TSU, TE, TO and HA, HI, FU, HE, HO and the semi-voiced sound sign (°) exists only for HA, HI, FU, HE and HO. For this reason, the successiveness of HA, HI, FU, HE or HO is increased by making the high-order half byte or the low-order half byte identical for the voiced sound sign and the semi-voiced sound sign.

With regard to numerals, since it frequently occurs that numerals frequently continue in succession and further since the probability that the space and the NUL sign are inserted between numerals, it is possible to increase the successiveness in half byte unit by effecting a similar data transformation.

The compression ratio can be increased further by forming a transformation table based on the transformation method described above and by effecting a second compression after having effected rearrangement of half byte data explained below.

A half byte data rearrangement circuit divides the compressed data which has passed through the first data compression circuit and which has been obtained by the data transformation described above, into two half bytes. The high-order half byte of one data block of 1 byte is combined with the high-order half byte of the adjacent data block to form one byte information and it is sent to a second compression circuit. The compression of the high-order half bytes is finished by repeating similar operations. Then, for the low-order half bytes, the compression is effected in the same way by combining the low-order half byte of one data block with that of the adjacent data block and by sending the combined one to the second compression circuit.

Here it should be noted that, if the half byte rearrangement according to this invention is effected directly for the transmitted data without effecting the first compression and the compression operation is effected only once, the compression ratio may be lower than that obtained without effecting any half byte rearrangement. This is because there may be cases where data, which is successive before half byte rearrangement and could be transformed into a compressed data of n bytes, can actually be transformed into data of 2n bytes if the data is compressed after half byte rearrangement without the first compression. In view of this, it is necessary to effect, according to this invention, compression operation always two times.

FIG. 1 shows variations of the data format, which is transformed and compressed by means of a data compression and restoration processing apparatus according to this embodiment and FIG. 2 is a scheme showing a data transformation table according to this embodiment.

The data 1 after the first compression indicated in FIG. 1 is transformed into the data 2 according to the transformation table indicated in FIG. 2 by means of a data compression apparatus to be described later. Then the data 2 is divided into a high-order half byte group 3 and a low-order half byte group 4. This high-order half byte group 3 can be subjected to the second data compression for an identical pattern.

In this way, after the first compression, there exist no compressible data in the data 1 as it is. However, since it is divided into the high-order half byte group 3 and the low-order half byte group 4, the former, which is a repetition of an identical pattern, is compressed to increase the compression ratio.

The first and the second data compressions can be effected by the method disclosed e.g. in the aforementioned U.S. Pat. No. 4,586,027, which is hereby incorporated by reference. It is a matter of course that the data compression may be effected not only by this method but also by other run-length methods.

The half byte rearrangement described above is effected for every predetermined even number of byte lengths as a unit to be half-byte rearranged.

FIG. 3 shows the data format after this half byte rearrangement. In the figure, a data group 9, which is a unit of transformation, consists of an even number of 256 bytes which number is convenient to form a group of data. The data 9 also consists of a high-order half byte group 5 and a low-order half byte group 6. The last group 0 consists of information 7 from 0 byte to 255 bytes (i.e., the number of bytes of one data group −1), and count values 8,8' representing its number of bytes. Here the information 7 is not subjected to the half byte rearrangement and is recorded as it is. In this way, regardless of the total number of data, even or odd, the half byte rearrangement can be effected without any problem.

The data indicated in FIG. 3 is subjected to the second (i.e. the last) data compression.

Now the restoration of the data, for which the half byte rearrangement has been effected in a group unit and which has been subjected to the second compression, will be explained.

This data is subjected at first to a first restoration. It is restored e.g. by the method disclosed e.g. in the aforementioned U.S. Pat. No. 4,586,027 or the like to the information in the state where the half byte rearrangement have been effected. Next, the information, for which the half byte rearrangement has been effected, is stored in a buffer in a group 9 unit and after that the operation proceeds to the restoration in the direction opposite to the variations in the data format indicated in FIG. 1. Therefore, it is recognized that the last group 0 differs from the ordinary group 9. For this reason the byte count 8 indicated in FIG. 3 can be recognized and it is possible to send the data 7, which is not half-byte rearranged to the second (last) restoration stage.

The normality of the format can be verified by confirming that the last information 8' and the information 8 previously stated are in accordance with each other. When the data are restored while displacing the magnetic tape, etc. in the backward direction, since the byte count 8' is at first confirmed, the necessary data 7 including the number of bytes indicated by the byte count 8' is transmitted as it is and the restoration begins to be executed, starting from the succeeding group 9.

FIG. 4 is a circuit diagram illustrating the construction of a data compressing device executing the operation described above, which is an embodiment of this invention. Transmitted data coming from a device of higher rank not shown in the figure is subjected to the first compression by a data compressor 101. Then rearranged data, for which the data transformation and the half byte rearrangement have been effected, is subjected to the second (last) compression by a data compressor 102 and compressed data is recorded on a magnetic tape, etc. The data compressors 101, 102 may be conventional compressing devices disclosed e.g. in the aforementioned U.S. Pat. No. 4,586,027. Therefore, detailed explanation thereof will be omitted.

Hereinbelow principally a transforming circuit 10 and a half byte rearranging circuit following the data compressor 101 will be explained. The data compressor 101 compresses a data series transmitted from the device of high rank stated above into a data series in the form of the data format 1 indicated in FIG. 1.

In FIG. 4, the data transforming circuit 10 sends data to the signal bus line 33 after having data-transformed the data given by the data compressor 101 according to the transformation table indicated in FIG. 2 to transmit the transformed data to the succeeding half byte rearranging circuit. Data buffers 15 and 16 are buffers for the purpose of storing the data transformed by the data transforming circuit 10. The data consisting of successive bytes is stored alternately in the data buffers 15 and 16 for every byte. The control therefor is effected by a buffer controlling circuit 11, on the basis of a strobe signal (hereinbelow abbreviated to STRB signal) coming from the device of higher rank. The addresses in the data buffers 15 and 16, where the data is stored, are assigned through a bus line 38 of a counter 13. One group of data is formed of 256 bytes and when the data storage of 256 bytes is terminated, a storage termination signal is sent to a rearrangement controlling circuit 19 and the buffer controlling circuit 11 through a signal line 37. In this way, the buffer controlling circuit 11 brings the buffers 15 and 16 in the output state and stops sending pulses 32 to a counter 13 for assigning the data storing address.

The rearrangement controlling circuit 19 transmits the STRB signal 45 to a device of a lower rank apparatus, such as a magnetic tape device, etc., not shown in the figure, and begins count-up of the counter 13 therewith. At the same time it sends a data selection signal 46 to a data selection circuit 21. The input 0 of the data selection circuit 21 being selected by putting 0 for this data selection signal 46, the data selection circuit 21 combines the high-order half bytes of the bytes sent from the data buffers 15, 16 through bus lines 40, 41 and outputs all the high-order half bytes of the 256 bytes. Then, putting 1 for the data selection signal 46, the data selection circuit 21 combines the low-order half bytes of the bytes and outputs all the low-order half bytes of the 256 bytes. The operation described above is repeated for every data group in the same way.

If the data outputted by the data transformation circuit 10 includes less than 256 bytes, a STOP signal comes into effect, after the last one byte has been inputted. The half byte transformation operation described above is stopped by this signal and another circuit consisting of a buffer controlling circuit 12, a data buffer 17 and a counter 14 begins to operate. The buffer controlling circuit 12, the buffer 17 and the counter 14 perform always the data storing operation parallelly to the circuits 11, 13, 15, 16 stated above. For data including less than 256 bytes, since no rearrangement operation is effected and the data is outputted as it is, there exists only one buffer. The address of the last data is latched by an address latch 18. When the rearrangement of all of the 256 bytes of the preceding group is terminated, the count value latched by the address latch 18 is outputted as length information through a bus line 43 by selecting the input 3 of the data selection circuit 21.

Subsequently the data stored in the data buffer 17 is outputted through a bus line 42 by selecting the input 2 of the data selection circuit 21. When it is detected by an address comparator 20 that the count value latched by the address latch 18 and the address indicated by the counter 14 are in accordance with each other, the input 3 of the data selection circuit 21 is again selected and the length information is outputted.

In this way, the operation of the half byte rearrangement circuit is terminated. The generated rearranged data is subjected again to a compression operation by another data compressor 102 and recorded by a magnetic tape memory device, etc. of lower rank not shown in the figure.

The compressed data is restored to the original data before compression by an operation which is inverse to that for the compression.

Figure 5:
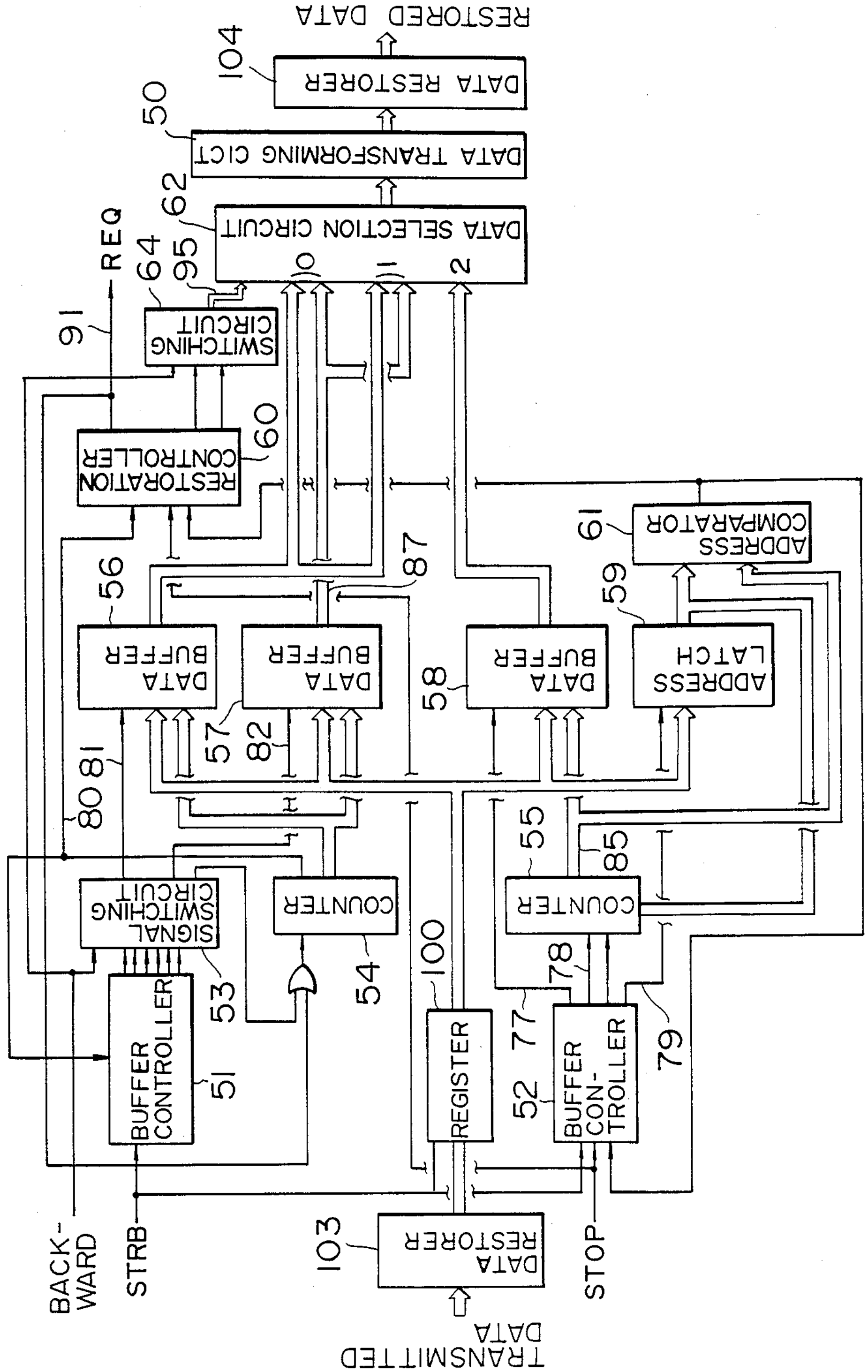
FIG. 5 is a scheme illustrating a data restoring circuit according to an embodiment of this invention.

FIG. 5 is a block diagram illustrating an embodiment of the data restoration circuit according to this invention. This restoration circuit will be explained below, referring to FIG. 5.

Compressed transmitted data coming from a magnetic tape device, etc., not shown in the figure, is restored at first to data in the data format after half byte rearrangement indicated at the bottom of FIG. 1 by a data restoration device 103. Another data restoration device 104 is a circuit in which the compressed data restored into the data format before data transformation indicated at the top of FIG. 1 by the circuit illustrated in FIG. 5 is subjected to the second restoration for restoring finally the compressed data. These data restoration devices may be those disclosed e.g. in the aforementioned U.S. Pat. No. 4,586,027 and therefore detailed explanation thereof will be omitted.

In FIG. 5, a register 100 is one for storing temporarily the data which has been subjected once to the data restoration operation, i.e. the data which is in the state identical to that of the data just after the half byte rearrangement. A data buffer 56 is one for storing a half of the data of 256 bytes, i.e. the former half 128 bytes of the data after the half byte rearrangement and another data buffer 57 is one for storing the latter half 128 bytes. The control of the storing operation is effected by switching signals generated by a buffer controlling circuit 51 on the basis of a STRB signal coming from a magnetic tape device, etc. of lower rank by means of a signal switching circuit 53. The addresses, where the data is stored, are assigned by a counter 54. The former half 128 bytes of the half-byte-rearranged 256 bytes are stored in the buffer 56 with the timing of a signal 81 and the latter half 128 bytes are stored in the buffer 57 with the timing of another signal 82. When the storage of the data of 256 bytes in total is terminated, a storage termination signal is sent to a restoration controlling circuit 60 and the buffer controlling circuit 51 through a signal line 51. Receiving this signal, the buffer controlling circuit 51 puts the data buffers 56 and 57 in the output state and initializes the counter 54. The restoration controlling circuit 60 outputs an REQ signal 91, which is a data transmission signal to a device of higher rank and starts count-up of the counter 54 therewith. At the same time the restoration controlling circuit 60 sends a signal to instruct data output to a signal switching circuit 64 and the signal switching circuit 64 send a data selection signal to a data selection circuit 62 through a signal line 95. At first the data selection signal being put at "0" the high-order half bytes of the first bytes in the buffers 56 and 57 are combined with each other so as to be outputted with the timing of the REQ signal 91. Next, the data selection signal being put at "1", the low-order half bytes of the first bytes are combined with each other so as to be outputted with the timing of the REQ signal 91.

Then, the data selection signal being put again at "0", the high-order half bytes of the second bytes in the buffers 56 and 57 are combined with each other so as to be outputted with the timing of the REQ signal 91. Next, the data selection signal being put again at "1", the lower-order half bytes of the second bytes are combined with each other so as to be outputted. This operation is repeated until the last 128-th byte so that the data of the half-byte rearranged 256 bytes stored in the data buffers 56 and 57 is restored in the data format indicated at the middle of FIG. 3.

If the data outputted by the register 100 includes less than 256 bytes, the STOP signal comes into effect after the last byte has been inputted. When the STOP signal comes into effect, the circuit operation described above is stopped and the circuit consisting of a buffer controlling circuit 52, a data buffer 58 and a counter 55 begins to work. This circuit performs always the data storing operation parallelly to the circuits 56, 57 stated above. For the data including less than 256 bytes the value of the byte 8 indicated in FIG. 3, which represents the length of the data, added at the head of the data at the half-byte-rearrangement, is taken in an address latch 59 in synchronism with the STRB signal with the timing of the output signal 79 of the buffer controlling circuit 52. Count-up of the counter 55 is started by a signal 78, which is in synchronism with the STRB signal and at the same time the data stored in the data buffer 58 begins to be outputted. For the data including less than 256 bytes, since no rearrangement operation is effected, it is outputted as it is. When it is confirmed by an address comparator 61 that the count value of the counter 55 and the value of the byte 8 representing the length of the data taken in the address latch 59 are in accordance with each other, all the data is completely discharged and this operation is terminated.

In the case of BACKWARD, i.e. in the case where the restoration is effected while driving the recording medium of a device of lower rank such as a magnetic tape, etc. in the backward direction, the head of the data sent by the device of lower rank is always the byte representing the length of the data including less than 256 bytes. If there is no data including less than 256 bytes, 2 bytes 8, 8' indicating that there is no data are added. Consequently, at first, the first byte representing the length of the data is stored in the data buffer 58 and at the same time the first byte is taken also in the address latch 59. The data of the second byte and the followings, which are not half-byte-rearranged, is stored in the buffer 58. When it is confirmed that the byte representing the length of the data taken in the address latch by the address comparator 61 and the count value of the address are in accordance with each other, the storage of the data is terminated. At this time a signal, which puts the data buffer 58 in the output state, is sent by the buffer controlling circuit 52 to the buffer 58 through a signal line 77 and the data buffer is put in the output state. At this time a signal to output data including less than 256 bytes is sent by a signal switching circuit 64 to the data selection circuit 62 through a signal line 95 and the data is outputted to a data transforming circuit 50. If there is no data including less than 256 bytes, at the point of time when the byte representing the length of the data is taken in, it is confirmed by the address comparator 61 that the value of the counter 55 and the value of the latched byte are in accordance with each other and no data is taken in the data buffer 58. After that the data of 256 bytes is outputted by the register 100, the former half consisting of 128 bytes being stored in the data buffer 57 and the latter half in the data buffer 56. The data buffers 56, 57 being put in the output state, the data selection signal being put at "1", the low-order half bytes of the first bytes in the data bffers 56 and 57 are combined so as to be outputted. Then the data selection signal is put at "0" and the high-order half bytes of the first bytes are combined so as to be outputted. The operation described above is repeated in the same way till the last 128-th bytes in the data buffers 56 and 57 so that the restoration of the data of the 256 bytes stored in the data buffer 56, 57 is terminated. This operation is effected for every group consisting of 256 bytes. In this way, the restoration operation of the data is performed. Further the data transforming circuit 50 transforms the data outputted by the data selection circuit 62 in the format indicated at the middle of FIG. 3 into data in the format indicated at the top of the figure.

By using the structure described above, the data compression and restoration method and apparatus according to this invention can increase the compression ratio by effecting the compression operation two times.

We claim:

1. A method of compressing a digital input data series consisting of a string of data blocks, comprising:

a first step of compressing said input data series including a portion consisting of successive identical data blocks so as to generate a compressed input data series of data blocks;

a second step of rearranging said compressed input data series, one group at a time, wherein one group comprises a predetermined number of data blocks, so as to obtain a new data series including a new portion consisting of successive identical data blocks, said second step including a step of combining together a first predetermined portion of each of the data blocks constituting one group so as to form a first subset of a new rearranged group that has the same number of data blocks as said predetermined number, and combining together second predetermined portions of the data blocks constituting one group, other than said first predetermined portions, so as to form a second subset of said new rearranged group and combining together said first and second subsets so as to form said new rearranged group; and a third step of compressing said new data series comprised of the new rearranged groups.

2. A method for compressing an input data series according to claim 1, wherein said second step includes:

a step for transforming said data blocks constituting said one group according to a predetermined transformation format so that said first predetermined portions of the data blocks constituting said one group are identical to each other; and a step for reconstituting said one group of the predetermined number of the data blocks so that said first predetermined portions of the data blocks are arranged successively so as to generate said first subset of the new rearranged group.

3. A method for compressing an input data series according to claim 2, wherein said reconstituting step includes a step for extracting said first predetermined portions of he data blocks of one block and outputting them in a first predetermined order to obtain said first subset of the new rearranged group, and substantially outputting said second predetermined portions in a second predetermined order to obtain said second subset of the new rearranged group.

4. A method for compressing an input data series according to claim 3, wherein each of said data blocks is constituted by one byte and each of said first predetermined portions of the data blocks includes either the high-order half byte or the low-order half byte of each of said data blocks.

5. A method for compressing an input data series according to claim 4, wherein said first predetermined order is an order according to which said high-order half byte or said low-order half byte of each of said data blocks is outputted successively and said second predetermined order is an order according to which said low-order half byte or said high-order half byte of each of said data blocks is outputted successively.

6. A method for restoring the data series obtained by the method of compression according to claim 1, comprising:

a fourth step of restoring the compressed new data series obtained by said third step so as to obtain said new rearranged data series comprised of the new groups of the predetermined number of data blocks;

a fifth step of rearranging said new rearanged data series, one new rearranged group at a time, so as to obtain said compressed input data series obtained by the first step, said fifth step including a step of combining together one of said first predetermined portions constituting said first subset of the new rearranged group and one of said second predetermined portions, corresponding to said one first predetermined portion, of said second subset of the new rearranged group, for all the predetermined portions contained in said new rearranged group, so as to rearrange said new rearranged group into said group; and sixth step of restoring said compressed input data series obtained by said fifth step.

7. An apparatus for restoring the data series obtained by the method of compression according to claim 1, comprising:

first means for restoring the compressed new data series obtained by said third step so as to obtain said new rearranged data series comprised of the new rearranged groups of the predetermined number of data blocks;

means for rearranging, one new rearranged group at a time, said new rearranged data series so as to obtain said compressed input data series obtained by the first step, said means for rearranging including means for combining together one of said first predetermined portions included in said first subset of the new rearranged group and one of said second predetermined portions, corresponding to said one of first predetermined portion, of said second subset of the new rearranged group, for all the predetermined portions contained in said new rearranged group, so as to rearrange said new group into said group; and means for restoring said compressed input data series obtained by said means for rearranging.

8. A method according to claim 1, wherein said second step includes:

a step of inhibiting said combining step for a last group which contains no data blocks or a number of data blocks less than said predetermined number; and a step of adding to each side of said last group a code representative of the number of data blocks contained in said last group.

9. A method according to claim 1, wherein said data block is comprised of one byte and said group is comprised of 256 bytes.

10. An apparatus for compressing an digital input data series, comprising:

first means for compressing said input data series including a portion consisting of successive identical data blocks so as to generate a compressed input data series;

second means for rearranging said compressed input data series, one group at a time, wherein one group comprises a predetermined number of data blocks, to obtain a new rearranged data series including a new portion consisting of successive identical data blocks, said second means including third means for combining together first predetermined portions of the data blocks that constitute one group to form a first subset, and for combining together second predetermined portions of the data blocks, other than said first predetermined portions of the data blocks, to form a second subset and fourth means for combining together first and second subsets; and fifth means for compressing said new rearranged data series.

11. An apparatus for compressing an input data series according to claim 12, wherein said third means includes:

means for transforming said data blocks of said group according to a predetermined transformation format so that said first predetermined portions of the data blocks constituting said group are identical to each other; and means for reconstituting said one group of the predetermined number of data blocks so that said first predetermined portions of the data blocks are rearranged successively so as to generate said new rearranged data series.

12. An apparatus for compressing an input data series according to claim 11, wherein each of said data blocks is constituted by one byte and each of said first predetermined portions of the data blocks includes either high-order half byte or the low-order half byte of each of said data blocks.

13. An apparatus according to claim 10, wherein said means for rearranging includes means for inhibiting said means for combining when a last group contains no data blocks or a number of data blocks less than said predetermined number and means for adding to each side of said last group a code representative of the number of bytes contained in the last group.

14. An apparatus according to claim 10, wherein said data block is comprised of one byte and said group is comprised of 256 bytes.

* * * * *

UNITED STATES PATENT AND TRADEMARK OFFICE
CERTIFICATE OF CORRECTION

PATENT NO. : 4,866,440

DATED : September 12, 1989

INVENTOR(S) : T. Tsukiyama, et al.

It is certified that error appears in the above-identified patent and that said Letters Patent is hereby corrected as shown below:

Column 2, line 21, after "In general" insert a comma.

Column 4, line 9, change "have" to --has--.

Column 6, line 32, change "send" to --sends--.

Column 6, line 34, after "At first" insert a comma and change "0" to --0,--.

Column 7, line 46, change "bffers" to --buffers--.

Column 8, line 37, change "he" to --the--.

Column 9, line 49, change "an" to --a--.

Column 10, line 22, change "claim 12" to --claim 10--.

Column 10, line 37, between "either" and "high-" insert --the--.

Signed and Sealed this

Twenty-eighth Day of August, 1990

*Attest:*

HARRY F. MANBECK, JR.

*Attesting Officer*

*Commissioner of Patents and Trademarks*